(12) United States Patent
Liao et al.

(10) Patent No.: US 11,008,451 B2
(45) Date of Patent: May 18, 2021

(54) FLUOROCARBON PREPREG AND RESIN COMPOSITION THEREOF

(71) Applicant: NAN YA PLASTICS CORPORATION, Taipei (TW)

(72) Inventors: Te-Chao Liao, Taipei (TW); Ying-Te Huang, Taipei (TW); Chih-Kai Chang, Taipei (TW); Hung-Yi Chang, Taipei (TW); Hao-Sheng Chen, Taipei (TW); Chia-Lin Liu, Taipei (TW)

(73) Assignee: Nan Ya Plastics Corporation, Taipei (TW)

( * ) Notice: Subject to any disclaimer, the term of this patent is extended or adjusted under 35 U.S.C. 154(b) by 29 days.

(21) Appl. No.: 16/202,165

(22) Filed: Nov. 28, 2018

(65) Prior Publication Data
US 2020/0165434 A1 May 28, 2020

(51) Int. Cl.
C08L 27/18 (2006.01)
C08J 5/24 (2006.01)
H05K 1/03 (2006.01)
H05K 1/02 (2006.01)

(52) U.S. Cl.
CPC ............... C08L 27/18 (2013.01); C08J 5/24 (2013.01); H05K 1/024 (2013.01); H05K 1/0373 (2013.01); C08J 2327/18 (2013.01); C08J 2427/18 (2013.01); C08J 2427/20 (2013.01); C08J 2429/10 (2013.01); C08J 2471/02 (2013.01); C08L 2203/20 (2013.01); C08L 2205/025 (2013.01); C08L 2205/03 (2013.01); C08L 2205/035 (2013.01); H05K 2201/015 (2013.01); H05K 2201/0209 (2013.01); H05K 2201/0257 (2013.01)

(58) Field of Classification Search
None
See application file for complete search history.

(56) References Cited

U.S. PATENT DOCUMENTS

2005/0153610 A1* 7/2005 McCarthy ............ C09D 127/12 442/59
2006/0020074 A1* 1/2006 Asada ................. B29C 37/0075 524/494
2010/0080959 A1* 4/2010 Harvey ................... C08L 27/18 428/172

* cited by examiner

Primary Examiner — Richard A Huhn
(74) Attorney, Agent, or Firm — Rosenberg, Klein & Lee

(57) ABSTRACT

A fluorocarbon resin composition is applicable to produce a prepreg for use in making a high-frequency circuit board, including a polytetrafluoroethylene resin; a fluorine-containing copolymer of poly fluoroalkoxy or fluorinated ethylene propylene; inorganic powders and an impregnation additive such as hydroxyethyl cellulose; resulted in that the prepreg is capable of increasing a plurality of times for proceeding impregnation-coating, the surface defects prone to occur on a fluorocarbon prepreg during drying, baking and sintering after impregnation are therefore improved at the same time.

7 Claims, 2 Drawing Sheets

FLUOROCARBON PREPREG AND RESIN COMPOSITION THEREOF

BACKGROUND OF THE PRESENT INVENTION

1. Field of the Invention

The present invention generally relates to a prepreg for high-frequency circuit boards and more particularly, to a prepreg using a fluorocarbon resin composition to exhibit excellent dielectric properties, and being applicable to high-frequency circuit substrates for microwave communication, satellite radars, automotive radars and wireless communication antennas. The fluorocarbon resin composition includes an impregnation additive and is an organic polymer with high boiling point and high viscosity characteristics. The fluorocarbon resin composition is characterized in that the amount of the prepreg is increased during impregnation and that the surface defects of the prepreg are overcome while retaining the excellent dielectric properties of the fluorocarbon polymer at the same time.

2. Description of Related Art

The development trend of modern electronic products has pushed the electronic equipment to perform at higher frequencies. More particularly, in the development of wireless networks, satellite radar communication and the current 5G communication, electronic communication products are bound to develop together with related technologies in high frequency bands (above 10 GHz) such that the popularization of fluorocarbon high-frequency substrates with better dielectric properties than those of conventional FR-4 or PPO high-frequency substrates has become increasingly prominent.

Due to the low surface energy of the fluorocarbon resin itself, it is not easy to feed the fiberglass cloth when being impregnation-coated with the fluorocarbon resin. Therefore, it is necessary to repeatedly perform impregnation-coating on the substrate to achieve a target content. During multiple impregnation-coating, environmental control is not easy such that impurities are easily mixed in the impregnation process to reduce the quality of the finished product and affect the yield.

Many prior art techniques have been developed to increase the feeding amount during impregnation-coating to reduce the number of times of performing impregnation-coating. U.S. Pat. No. 5,897,919 discloses a fluorocarbon resin impregnated fiberglass cloth, which is subjected to multiple impregnations to achieve a target content. By adjusting the temperature of the furnace body to be below the melting point of polytetrafluoroethylene (PTFE), about 250° C. to 320° C., the PTFE is not sintered to form a film, and the wetting effect of the substrate surface during subsequent impregnation-coating is improved to increase the feeding amount. Although the method reduces the number of times of impregnation, the additional additive is hard to be completely decomposed in the furnace without the high-temperature calcination process, which affects the subsequent substrate processing quality.

Another prior art discloses a fluorocarbon resin impregnated fiberglass cloth, which enhances the adhesion between the fluorocarbon resin and the silane treated fiberglass cloth by adding organic silane. Even though the impregnation is improved, the effect of subsequent multiple coatings to achieve a target content is limited.

Although the above prior art indeed increases the feeding amount to be impregnated, at the same time, and surface defects such as dents, blistering, cracking, and crater phenomena are easily caused on the surface of the substrate. Therefore, in order to avoid these problems, many prior art disclosures directly achieve a target content by sandwiching between fiberglass cloth layers. As disclosed in prior art, a copper foil substrate is directly formed by high-temperature vacuum bonding of a fiberglass cloth and a PTFE film. Although this method avoids the aforementioned processing problems, the non-melted characteristics of PTFE itself make it hard to completely bond the fiberglass cloth with the PTFE film, resulting in poor adhesion.

Prior art also teaches to obtain a non-sintered pre-treated cloth by immersing a fiberglass cloth in a fluorocarbon resin, and superimposes the pre-treated cloth with a fluorocarbon resin film to achieve a target content. This method improves the adhesion between the fiberglass cloth and the fluorocarbon resin film. However, the non-sintering process tends to cause the residual processing aid to result in subsequent processing defects. Additionally, the use of a large amount of the fluorocarbon resin film to increase the manufacturing cost is not satisfactory.

In view of the above, in order to solve the problems that it is not easy to feed the fiberglass cloth when being impregnation-coated with the fluorocarbon resin and that the surface defects are easily caused on the surface of the substrate, the present invention provides a fluorocarbon prepreg and a fluorocarbon resin composition thereof to overcome the above problems.

SUMMARY OF THE INVENTION

The existing high-frequency substrates are mainly divided into FR-4 substrates, PPO ceramic substrates and fluorocarbon substrates. For applications with higher frequency bands above 10 GHz, fluorocarbon substrates play the key role for high frequency applications because of the need for more stringent dielectric performance requirements. In the prior art techniques, the composition of a fluorocarbon substrate is made of thermoplastic PTFE as the main constituent resin, because the hydrogen atoms around the main chain carbon atoms are replaced by fluorine atoms having the highest electronegativity.

Having extremely high crystallinity, PTFE has many unique properties as described below: (1) excellent chemical inertness and good chemical resistance; (2) excellent thermal stability with long-term use temperature from −50° C. to 260° C.; (3) symmetric structure with excellent dielectric properties (such as low dielectric constant and low dielectric loss) for use in high-end electrical insulation materials; and (4) lowest surface energy among all polymers to exhibit lubricity, non-adhesiveness, and non-wettability on the surface of the product.

However, PTFE has many processing limitations, and there are many problems to be solved in its applications. Since PTFE maintains a very high viscosity at the melting point without meltability, the molding process is not easily carried out by conventional thermoplastic plastic processes. Therefore, most of the prior art techniques introduce perfluoro or non-perfluoro meltable fluorocarbon resins such as poly fluoroalkoxy (PFA), fluorinated ethylene propylene (FEP), ethylene tetrafluoroethylene (ETFE), ethylene chlorotrifluoroethylene (ECTFE), polyvinyl fluoride (PVF) and polyvinylidene fluoride (PVDF) having a much lower crystallinity than that of PTFE to improve the processing stability. Perfluoro resins (PFA, FEP) maintain excellent dielectric properties with lower processing temperatures, but they are more expensive, which limits the popularity of their applications. Non-perfluoro resins (ETFE, ECTFE, PVF, PVDF, etc.) exhibit lower processing temperatures and superior mechanical properties, but they have a lower temperature for long-term use such that the thermal stability, chemical resistance and dielectric properties for high-frequency circuit substrates are significantly poorer than they are required.

When a printed circuit board is subjected to the processes for forming through holes and pads, the through holes can be easily broken and even the printed circuit board can be delaminated when the difference between the coefficients of thermal expansion (CTE) of the printed circuit board and copper is too large. The coefficient of thermal expansion of PTFE at 25° C. to 300° C. is about 220 ppm/° C., which causes many back-end processing problems of the printed circuit board when PTFE is applied to the substrate material. Therefore, in most of the prior art techniques, organic or inorganic fillers (such as glass fibers, inorganic powders, hollow glass beads, and polymer powders) are added to increase the rigidity and the dimensional stability and lower the coefficient of thermal expansion of the overall substrate. In addition, in the prior art techniques, fillers with different dielectric properties are added to adjust the dielectric properties of the overall substrate for high-frequency circuit applications with high dielectric constant and low dielectric loss characteristics to implement various applications of the high-frequency fluorocarbon substrate.

Since the hydrogen atoms around the main chain carbon atoms of PTFE are replaced by fluorine atoms having the highest electronegativity, PTFE exhibits the lowest surface energy among all polymers (with a surface tension of about 18.5 mN/m). PTFE is almost completely free from being wetted by water, and it is thus widely used in oil-free lubrication and friction-reduction applications. As a result, PTFE has a major disadvantage for multiple impregnation-coating. The low feeding amount leads to an increase of the number of times of impregnation-coating, and poor wettability during impregnation-coating causes defects on the surface. The prior art techniques mainly enhance the feeding amount by adding various organic silane compounds to carry out reactions by using reactive groups. However, during high-temperature drying, baking and sintering after impregnation-coating, surface defects may occur due to poor wettability of the substrate surface and sudden boiling at high temperature, which is still a problem.

In view of the above, the present invention provides a fluorocarbon resin composition for use in the manufacture of a prepreg applicable to high-frequency circuit boards. The fluorocarbon resin composition includes: (1) a polytetrafluoroethylene (PTFE) resin; (2) a fluorine-containing copolymer, selected from the group consisting of one or a combination of more of poly fluoroalkoxy (PFA) and fluorinated ethylene propylene (FEP); (3) inorganic powders (fillers); and (4) an impregnation additive, selected from the group consisting of one or a combination of more of hydroxyethyl cellulose, nitrocellulose, polymethyl styrene, polymethyl methacrylate and polyethylene glycol.

The fluorocarbon resin composition according to the present invention is characterized in that the fluorocarbon resin composition contains, on the basis of the total weight of the fluorocarbon resin composition being 100 wt %:
(1) a polytetrafluoroethylene (PTFE) resin, accounting for 30 to 70 wt % of the fluorocarbon resin composition;
(2) a fluorine-containing copolymer, selected from the group consisting of one or a combination of more of poly fluoroalkoxy (PFA) and fluorinated ethylene propylene (FEP), and accounting for 1 to 10 wt % of the solid content of the fluorocarbon resin composition;
(3) inorganic powders, accounting for 5 to 60 wt % of the solid content of the fluorocarbon resin composition; and
(4) an impregnation additive, selected from the group consisting of one or a combination of more of hydroxyethyl cellulose, nitrocellulose, polymethyl styrene, polymethyl methacrylate and polyethylene glycol, and accounting for 0.1 to 10 wt % of the solid content of the fluorocarbon resin composition.

The resin contained in the fluorocarbon prepreg and the fluorocarbon resin composition thereof includes polytetrafluoroethylene (PTFE) and a fluorine-containing copolymer. PTFE accounts for 30 to 70 wt %, preferably 40 to 60 wt % of the solid content of the fluorocarbon resin composition. The fluorine-containing copolymer is selected from one or a combination of poly fluoroalkoxy (PFA) and fluorinated ethylene propylene (FEP), and accounts for 1 to 10 wt % of the solid content of the fluorocarbon resin composition. If the content of the fluorine-containing copolymer is more than 10 wt %, glue flow is likely to occur after the substrate is pressed, which affects the processability and thickness uniformity of the substrate. If the content of the fluorine-containing copolymer is less than 1%, voids are likely to occur.

The above mentioned PTFE resin has a structure shown in Structural Formula (A):

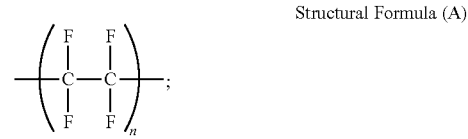

Structural Formula (A)

where n is an integer and n≥1.

The structure of poly fluoroalkoxy (PFA) is as shown in Structural Formula (B):

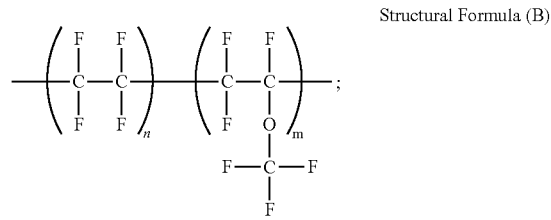

Structural Formula (B)

where n and m are integers, and n≥1 and m≥1.

The structure of fluorinated ethylene propylene (FEP) is as shown in Structural Formula (C):

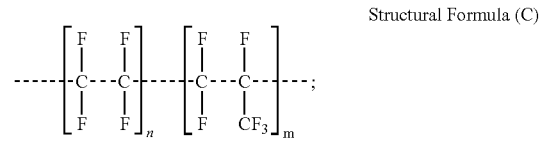

Structural Formula (C)

where n and m are integers, and n≥1 and m≥1.

The inorganic powders contained in the fluorocarbon resin composition may be one or a combination of spherical or irregular silicon dioxide ($SiO_2$), titanium dioxide ($TiO_2$), aluminum hydroxide (Al(OH)$_3$), alumina (Al$_2$O$_3$), magnesium hydroxide (Mg(OH)$_2$), magnesium oxide (MgO), calcium carbonate (CaCO$_3$), boron oxide (B$_2$O$_3$), calcium oxide (CaO), strontium titanate (SrTiO$_3$), barium titanate (BaTiO$_3$), calcium titanate (CaTiO$_3$), magnesium titanate (2MgO.TiO$_2$), boron nitride (BN), aluminum nitride (AlN), silicon carbide (SiC), cerium oxide (CeO$_2$) and fume silica.

The average particle diameter of the inorganic powders is preferably in the range of 0.01 to 20 microns. The smoked vermiculite is a porous nano-sized vermiculite particle having an average particle diameter of 1 to 100 nanometers (nm). SiO$_2$ may be a molten type and a crystalline type. Considering the dielectric properties, SiO$_2$ is preferably a molten type. The inorganic powders account for 5 to 60 wt %, preferably 30 to 50 wt %, of the solid content of the fluorocarbon resin composition. If the inorganic p powders account for more than 60 wt % of the fluorocarbon resin composition, the suspension property of the fluorocarbon resin composition is affected and precipitation is likely to occur during the impregnation process, resulting in poor uniformity and uneasy processing of the prepreg.

The impregnation additive contained in the fluorocarbon resin composition is used to adjust the overall viscosity, boiling point and wetting characteristics of the fluorocarbon resin composition. In addition, another feature of the impregnation additive is that it can be cracked and eliminated at temperatures above 300° C.

The impregnation additive may be one or a combination of more of hydroxyethyl cellulose, nitrocellulose, polymethyl styrene, polymethyl methacrylate and polyethylene glycol. If necessary, the impregnation additive is dissolved in a suitable solvent and then added to the fluorocarbon resin composition. The polyethylene glycol may have a molecular weight of 200 to 20,000, and the viscosity varies according to the molecular weight thereof, and is preferably PEG2000 to PEG4,000 for an average molecular weight of 2,000 to 4,000. The impregnation additive accounts for 0.1 to 10 wt %, preferably 3 to 5 wt %, of the solid content of the fluorocarbon resin composition. If the solid content is more than 10 wt %, the viscosity of the fluorocarbon resin composition is too high, which tends to affect the flatness of the prepreg film to further cause surface roughness. If the impregnation additive accounts for less than 0.1 wt %, the prepreg is liable to have surface void defects.

The impregnation additive is selected from one or a combination of more of hydroxyethyl cellulose, nitrocellulose, polymethyl styrene, polymethyl methacrylate and polyethylene glycol, and the structures thereof are respectively as shown in Structural Formula (D) to Structural Formula (H):

Structural Formula (D)

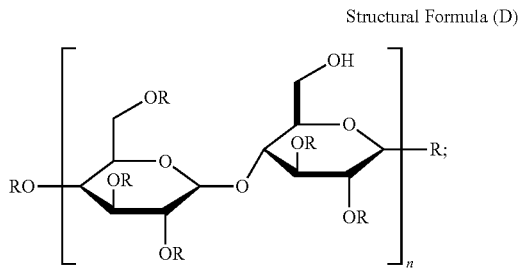

where n=1 to 50, and R is H or —(CH$_2$CH$_2$O)$_X$H, X=1 to 10;

Structural Formula (E)

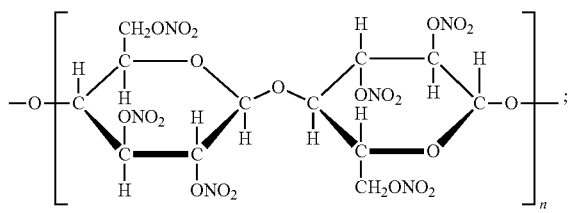

where n=1 to 50;

Structural Formula (E)

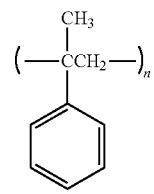

where n=1 to 50;

Structural Formula (G)

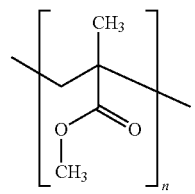

where n=1 to 50; and

Structural Formula (H)

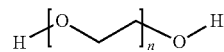

wherein n=1 to 200.

In the present invention, an impregnation additive is added to the fluorocarbon resin emulsion such that, during high-temperature drying, baking and sintering of the fiberglass cloth in a furnace after impregnation-coating, the substrate surface is not easily affected by the lower surface energy of the fluorocarbon resin itself to cause appearance defects at high temperatures due to sudden boiling at high temperatures by using the high boiling point and wetting property of the organic polymer. In addition, the addition of the impregnation additive also enhances the viscosity of the fluorocarbon resin composition, increases the feeding amount during multiple impregnation-coating, and reduces the number of times of impregnation-coating. The impregnation additive is completely decomposed at about 300° C. and does not leave ash. Therefore, the processing characteristics of the subsequent copper foil substrate process are not affected to maintain the excellent electrical properties of the fluorocarbon resin.

The copper foil substrate obtained by using the fluorocarbon resin composition of the fluorocarbon prepreg exhibits excellent appearance, excellent electrical properties, low dielectric constant and low dielectric loss, and has excellent dimensional stability and rigidity.

DETAILED DESCRIPTION OF THE INVENTION

The following examples are prepared by the inventors of the present invention, and the objects and advantages of the present invention will become more apparent from the comparative examples. The preferred embodiments of the present invention are described in detail below, but the scope of the present invention is not limited to the following embodiments. The present invention can be implemented with modifications within the scope of the claims.

Embodiments 1 to 5, Comparative Examples 1 to 4

Preparation of fluorocarbon resin composition prepreg: According to the formulations and ratios listed in Table 1, the preparation of the fluorocarbon resin composition prepreg is carried out, and the preparation steps are as follows. The PTFE resin emulsion and the fluorine-containing copolymer resin emulsion were uniformly stirred and mixed at a rotation speed of 100 rpm for 20 minutes. Then, inorganic powders were added to the above uniformly mixed emulsion, and stirred at a rotation speed of 500 rpm for 30 minutes until the inorganic powders were uniformly dispersed and suspended in the emulsion. Finally, an impregnation additive (for example, polyethylene glycol) was added to the above uniformly mixed emulsion and uniformly stirred and mixed at a rotation speed of 100 rpm for 20 minutes to obtain a fluorocarbon resin composition prepreg (this step is omitted if no impregnation additive is added). The viscosity of the final fluorocarbon resin composition was measured, and the measured viscosity values are listed in Table 1.

Fiberglass cloth impregnated in fluorocarbon resin composition prepreg: A fiberglass cloth is impregnated in the fluorocarbon resin composition prepreg prepared above and it is fed into a furnace for drying (at 80 to 120° C.), baking (at 200 to 240° C.) and sintering (at 340 to 360° C.). All sections of the heating process are maintained for at least 20 minutes. The impregnation-coating and heating steps were repeated several times until the thickness of the fluorocarbon resin composition layer was about 55 μm. The actual impregnation times and thicknesses of the respective embodiments and comparative examples are listed in Table 1.

The fluorocarbon resin composition impregnated body obtained above was pressed against a copper foil at a temperature of 350° C. and a pressure of 50 kg/cm$^2$ to obtain a copper foil substrate. The dielectric constant Dk and the dielectric loss Df at a frequency of 10 GHz were measured by a Dielectric Analyzer HP Agilent E4991A to evaluate the dielectric properties of the substrate.

In the embodiment, the viscosity is adjusted by adding impregnation additives with different viscosities in the fluorocarbon resin composition. The feeding amount during impregnation-coating is significantly improved compared with the comparative example 1 without the addition of immersion additives, resulting in enhanced viscosity and reduced number of times of impregnation-coating.

Figure 1:
FIG. 1 shows a scanning electron microscope (SEM) image of a fluorocarbon prepreg according to one embodiment of the present invention.
Figure 2:
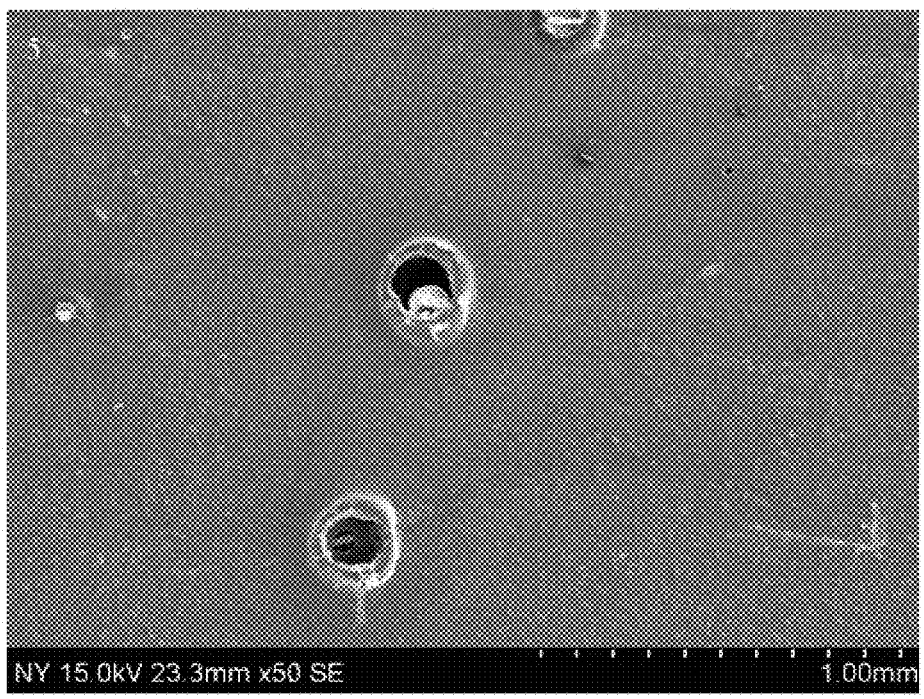
FIG. 2 shows a scanning electron microscope (SEM) image of a fluorocarbon prepreg of comparative example 1.

In addition, the effect of adding impregnation additives on the appearance of the prepreg can be seen in the scanning electron microscope (SEM) image in FIG. 1 and FIG. 2. It can be seen from FIG. 1 that the appearance of the prepreg prepared in Embodiment 1 is evenly flat, and in FIG. 2, it is apparent that the prepreg of Comparative Example 1 has a significant surface coating defect.

Figure 3:
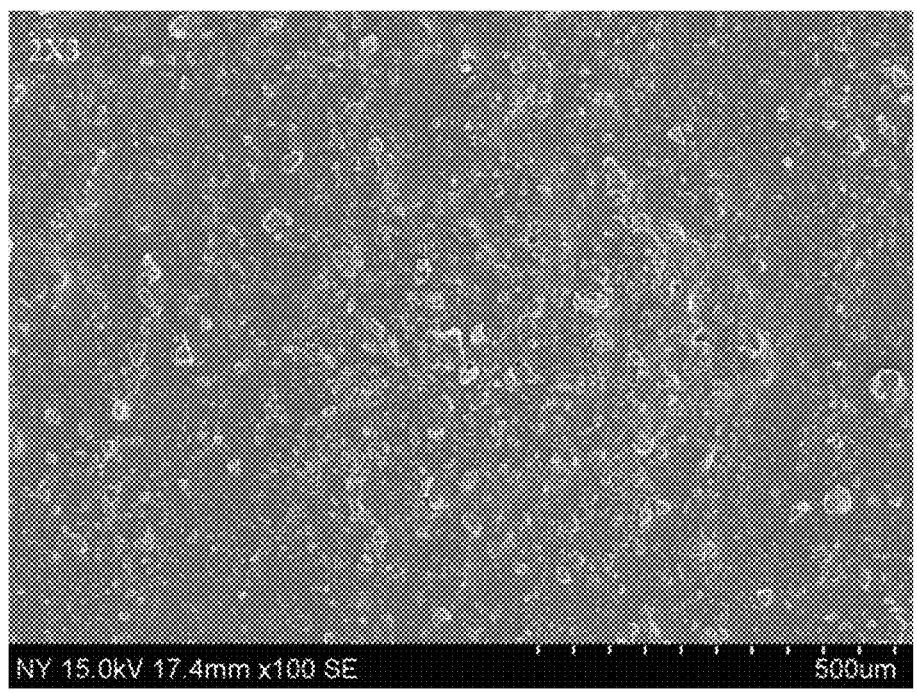
FIG. 3 shows a scanning electron microscope (SEM) image of a fluorocarbon prepreg of comparative example 2.

The viscosity of the fluorocarbon resin composition of the present invention is controlled to fall within an appropriate range by adjusting the content of the impregnation additive. From Comparative Example 2, it can be found that film formation of the prepreg is deteriorated such that the surface is rough and the resin is easy to fall off when the viscosity of the fluorocarbon resin composition is too high. The appearance is shown in the scanning electron microscope (SEM) image in FIG. 3.

In Comparative Example 3, an excessive amount of poly fluoroalkoxy copolymer resin was added to cause severe glue overflow after pressing, which was disadvantageous for subsequent processing of the printed circuit board.

In Comparative Example 4, an excessive amount of inorganic powders were added to cause poor suspension of the fluorocarbon resin composition and a large amount of powder precipitation at the bottom, which was disadvantageous for the impregnation process.

The copper foil substrate prepared by high-temperature hot pressing of the prepreg according to the invention exhibits excellent dielectric properties, and the dielectric loss can be preferably as low as 0.0009, which meets the dielectric characteristics required for high frequency communication. The Dk and Df values of the embodiments and comparative examples at 10 GHz are listed in Table 1.

Comparing the results of the embodiments and the comparative examples, the addition of the impregnation additive to the fluorocarbon resin composition can effectively increase the feeding amount during impregnation-coating and reduce the number of times of feeding. The number of times of feeding to the target thickness is related to the viscosity of the fluorocarbon resin composition. Furthermore, the high boiling point and wetting property of the impregnation additive overcome the problematic surface defects caused by high temperature heating after impregnation-coating so as to obtain a fluorocarbon resin composition prepreg with a uniformly smooth surface.

TABLE 1

Composition of Prepreg Formulations of Embodiments and Comparative Examples and Their Implementation Results

| Composition (wt %) | | Embodiments | | | | | Comparative Examples | | | |
|---|---|---|---|---|---|---|---|---|---|---|
| | | 1 | 2 | 3 | 4 | 5 | 1 | 2 | 3 | 4 |
| polytetrafluoro-ethylene resin | PTFE | 40 | 40 | 60 | 60 | 60 | 42 | 35.8 | 30 | 25 |
| fluorine-containing copolymer | PFA | 5 | 5 | 5 | — | 2.5 | 5.3 | 4.5 | 15 | 5 |
| | FEP | — | — | — | 5 | 2.5 | — | — | — | — |
| inorganic powders | SiO2 | 30 | 30 | 15 | 15 | 15 | 31.6 | 26.8 | 30 | 45 |
| | TiO2 | 20 | 20 | 15 | 15 | 15 | 21.1 | 17.9 | 20 | 20 |
| impregnation additive | PEG 4000 | 5 | — | 5 | 5 | 5 | — | 15 | 5 | 5 |
| | PEG 2000 | — | 5 | — | — | — | — | — | — | — |
| Viscosity (cp) | | 120 | 50 | 100 | 105 | 100 | 30 | 300 | 110 | 100 |
| Times of impregnation-coating | | 5 | 7 | 6 | 6 | 6 | 8 | 4 | 5 | — |
| Thickness (μm) | | 55 | 55 | 56 | 55 | 56 | 53 | 57 | 54 | — |
| Suspension of fluorocarbon resin composition | | good | good | good | good | good | good | good | good | poor |
| Prepreg surface profile | | good | good | good | good | good | poor | poor | good | — |
| Glue flow after pressing | | good | good | good | good | good | poor | poor | poor | — |
| Dk (10 GHz) | | 3.42 | 3.40 | 2.81 | 2.90 | 2.852 | 3.35 | 3.54 | 3.23 | — |
| Df (10 GHz) | | 0.0018 | 0.0015 | 0.0009 | 0.0011 | 0.0012 | 0.0017 | 0.0039 | 0.0030 | — |

What is claimed is:

1. A fluorocarbon resin composition, characterized in that the fluorocarbon resin composition comprises, on the basis of the total weight of the fluorocarbon resin composition being 100 wt %:
   (1) a polytetrafluoroethylene (PTFE) resin, in a range from 40 to below 60 wt % of the fluorocarbon resin composition;
   (2) a fluorine-containing copolymer, selected from a group consisting of at least one of poly fluoroalkoxy (PFA), fluorinated ethylene propylene (FEP) and combinations thereof in a range from 1 to 10 wt % of the solid content of the fluorocarbon resin composition;
   (3) inorganic powders in a range from 30-50 wt % of the solid content of the fluorocarbon resin composition; and
   (4) an impregnation additive uniformly mixed with said PTFE, fluorine-containing copolymer, and inorganic powders, said impregnation additive being selected from a group consisting of at least one of hydroxyethyl cellulose, nitrocellulose, polymethyl styrene, polymethyl methacrylate and polyethylene glycol, and accounting for 0.1 to 10 wt % of the solid content of the fluorocarbon resin composition.

2. The fluorocarbon resin composition according to claim 1, wherein the structure of the polytetrafluoroethylene resin is as shown in Structural Formula (A):

Structural Formula (A)

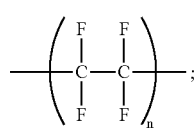

where n is an integer and n≥1.

3. The fluorocarbon resin composition according to claim 1, wherein the structure of poly fluoroalkoxy (PFA) is as shown in Structural Formula (B):

Structural Formula (B)

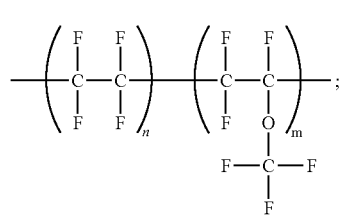

where n and m are integers, and n≥1 and m≥1.

4. The fluorocarbon resin composition according to claim 1, wherein the structure of fluorinated ethylene propylene (FEP) is as shown in Structural Formula (C):

Structural Formula (C)

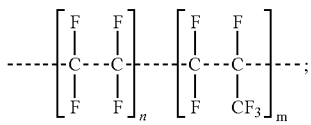

where n and m are integers, and n≥1 and m≥1.

5. The fluorocarbon resin composition according to claim 1, wherein the inorganic powders is one or more selected from the group consisting of silicon dioxide (SiO$_2$), titanium dioxide (TiO$_2$), aluminum hydroxide (Al(OH)$_3$), alumina (Al$_2$O$_3$), magnesium hydroxide (Mg(OH)$_2$), magnesium oxide (MgO), calcium carbonate (CaCO$_3$), boron oxide (B$_2$O$_3$), calcium oxide (CaO), strontium titanate (SrTiO$_3$), barium titanate (BaTiO$_3$), calcium titanate (CaTiO$_3$), magnesium titanate (2MgO.TiO$_2$), boron nitride (BN), aluminum nitride (AlN), silicon carbide (SiC), cerium oxide (CeO$_2$) and fume silica.

6. The fluorocarbon resin composition according to claim 1, wherein the structures of hydroxyethyl cellulose, nitrocellulose, polymethyl styrene, polymethyl methacrylate and polyethylene glycol are as shown in Structural Formulas (D) to (H):

Structural Formula (D)

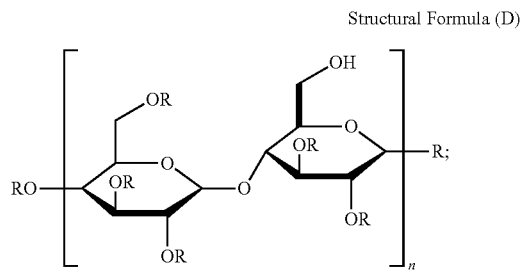

where n=1 to 50, and R is H or $-(CH_2CH_2O)_xH$, X=1 to 10;

Structural Formula (E)

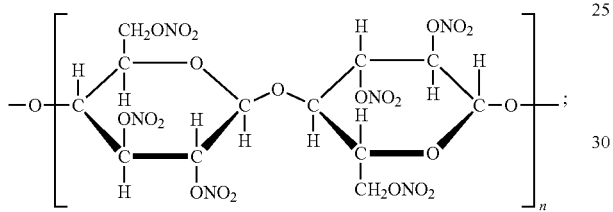

where n=1 to 50;

Structural Formula (F)

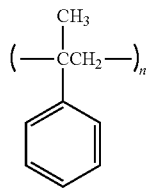

where n=1 to 50;

Structural Formula (G)

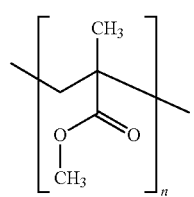

where n=1 to 50; and

Structural Formula (H)

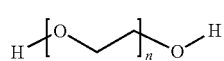

wherein n=1 to 200.

7. A fluorocarbon resin prepreg manufactured by impregnation-coating the fluorocarbon resin composition of claim 1 onto a fiberglass cloth for a plurality of times.

* * * * *